United States Patent [19]

Siegenthaler

[11] Patent Number: 4,580,094

[45] Date of Patent: Apr. 1, 1986

[54] ACTIVE CAPACITIVE VOLTAGE TRANSFORMER

[75] Inventor: Andreas Siegenthaler, Mönchaltorf, Switzerland

[73] Assignee: BBC Brown, Boveri & Company, Limited, Baden, Switzerland

[21] Appl. No.: 506,806

[22] Filed: Jun. 22, 1983

[30] Foreign Application Priority Data

Jun. 25, 1982 [CH] Switzerland ............... 3919/82

[51] Int. Cl.⁴ .................. G01R 15/06; H02G 15/28
[52] U.S. Cl. ...................... 324/126; 174/11 BH; 174/143
[58] Field of Search ............ 324/126, 133; 361/303; 174/11 BH, 143; 323/364

[56] References Cited

U.S. PATENT DOCUMENTS 4,240,031 12/1980 Siegenthaler ............... 324/126
4,354,154 10/1982 Schiemann ............... 324/126

Primary Examiner—Ernest F. Karlsen
Attorney, Agent, or Firm—Burns, Doane, Swecker & Mathis

[57] ABSTRACT

A voltage transformer for a metal encapsulated gas-filled high-voltage switching system which supplies high accuracy test values even under varying operating conditions of the switching system comprises an active capacitive voltage divider in which a cylindrical test electrode and an associated counter electrode are attached by insulating elements to a flexurally rigid cylindrical support element in spaced relationship. In addition, each electrode is attached to the same annular face of the associated insulating element which partially abuts the cylindrical support element.

3 Claims, 4 Drawing Figures

ACTIVE CAPACITIVE VOLTAGE TRANSFORMER

FIELD OF THE INVENTION

The present invention relates in general to voltage transformers for measuring the voltage of a current-conducting inner conductor of a metal-encapsulated, gas-insulated high-voltage switching system, and in particular to such transformers having an active capacitive voltage divider.

BACKGROUND OF THE INVENTION

Such a voltage transformer is disclosed in Swiss Pat. No. 627,853. This voltage transformer comprises a cylindrical test electrode and an associated counter electrode. At least one of the two electrodes has at least two concentric radially projecting rings defining at least one cylindrical socket therebetween and the other of the electrodes has a ring which is disposed in each socket formed in the other electrode. The test and counter electrodes are supported on a disc-shaped support element. The force of the insulating gas located in the interior of the metal encapsulation acts on the support element, which is capable, if required, of bending slightly. Such bending causes the counter electrodes to be displaced toward and away from each other. A similar displacement of the test and counter electrodes can also be caused by shrinkage of certain insulating elements due to thermal or hygroscopic causes. These displacements of the electrodes with respect to one another cause the gas path between them, and thus the capacitance determining the accuracy of a test, to be changed. Such a voltage transformer, therefore, does not always produce the precision required in high-accuracy classes of systems.

SUMMARY OF THE INVENTION

A principal object of the present invention is thus to provide a general purpose voltage transformer which supplies test values which meet the requirements of high accuracy classes of switching systems despite varying operating conditions of the systems.

In accordance with the present invention, at least one electrode assembly is provided having test and counter electrodes which are mounted on a flexurally rigid support element that is a support element that has good strength against bending, in spaced relationship with respect to an axis of the support element by means of insulating elements such that a common insulating element mounting surface both supports the associated electrode and partially abuts the support element. The support element advantageously is mounted on a holder so as to extend transversely with respect to the axis of the system piping or forms a part of the system piping.

A particular advantage of a voltage transformer constructed in accordance with the present invention is that the capacitances of the voltage divider remain nearly constant even under the most varied operating conditions of the switching system. As a consequence, the voltage transformer of the present invention can meet the high accuracy requirements of, for example, class 0.2, without difficulty.

BRIEF DESCRIPTION OF THE DRAWING

In the detailed description which follows, illustrative embodiments of the invention will be explained in greater detail with reference to the drawing, in which.

In the figures, similar elements are denoted by similar reference symbols.

DETAILED DESCRIPTION OF THE PREFERRED EMBODIMENTS

Figure 1:
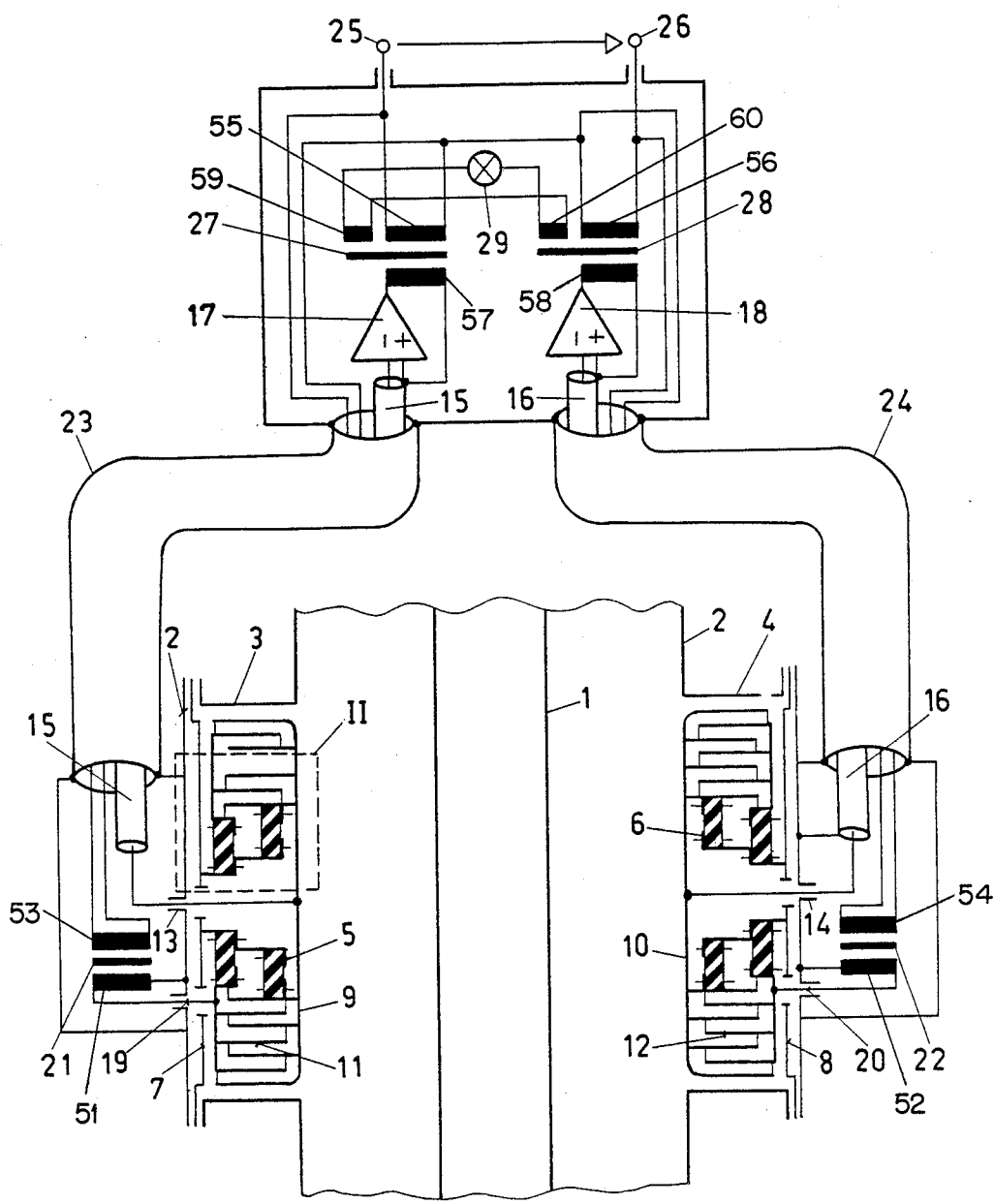
FIG. 1 is a partially diagramatic and partially schematic representation of a portion of a metal encapsulated, gas-filled high-voltage switching system incorporating a first embodiment of the voltage transformer of the present invention in which two electrode assemblies for determining the test voltage are disposed transversely with respect to the inner current conductor of the switching system.

Referring to FIG. 1, the present invention is intended for use with a metal-encapsulated, gas-filled high-voltage switching system comprising an inner conductor 1 for carrying alternating current which is disposed in encapsulating metal piping 2 filled with a gaseous insulating agent such as sodium hexafluoride ($SF_6$).

The embodiment of the present invention shown in FIG. 1 comprises two identical active capacitive voltage dividers which are series connected to provide the test output voltage. Specifically, piping 2 is provided with two pipe sockets 3 and 4 which are diametrically opposite to one another. An electrode assembly, denoted 5 and 6, respectively, is disposed in each socket 3 and 4. The electrode assemblies 5 and 6 have approximately the same dimensions and are spaced at approximately the same distance from inner conducter 1. Each electrode assembly 5,6 is provided with a test electrode 9,10 and a counter electrode 11,12 attached to a support assembly 7,8. The inner conductor 1 and each of the two test electrodes 9,10 form in each case the high-end voltage capacitor, and each of the two test electrodes 9,10 and its associated counter electrode 11,12 form in each case the low-end voltage capacitor of an active capacitive voltage divider.

Each test electrode 9,10 is electrically connected via a piping lead-through 13,14 and a screened test cable 15,16 to an input of a preamplifier 17,18. Each of the two counter electrodes 11,12 is electrically connected via another piping lead-through 19,20 to one end of the primary winding 51,52 of a continuously variable amplifying transformer 21,22 which preferably is disposed adjacent to the piping 2 in the vicinity of the associated electrode assembly. The other end of the primary winding 51,52 of each transformer 21,22 is connected to ground via piping 2.

The secondary winding 53,54 of each transformer 21,22 is connected via another screened test cable 23,24 to the secondary winding 55,56 of another transformer 27,28. Transformers 27,28 each have two secondary windings 55,56 and 59,60. The two secondary windings 55,56 are directly connected together in series, as shown and the two secondary winding ends of windings 55,56 which are not connected together are connected to output terminals 25 and 26, respectively, for tapping off the test voltage. Secondary windings 59,60 are connected directly together at one end thereof and via a lamp 29 at the other end thereof. The primary windings 57,58 of transformers 27 and 28 are in each case connected at one end to a grounded input and at the other end to the output of the associated preamplifier 17, 18.

Figure 2:
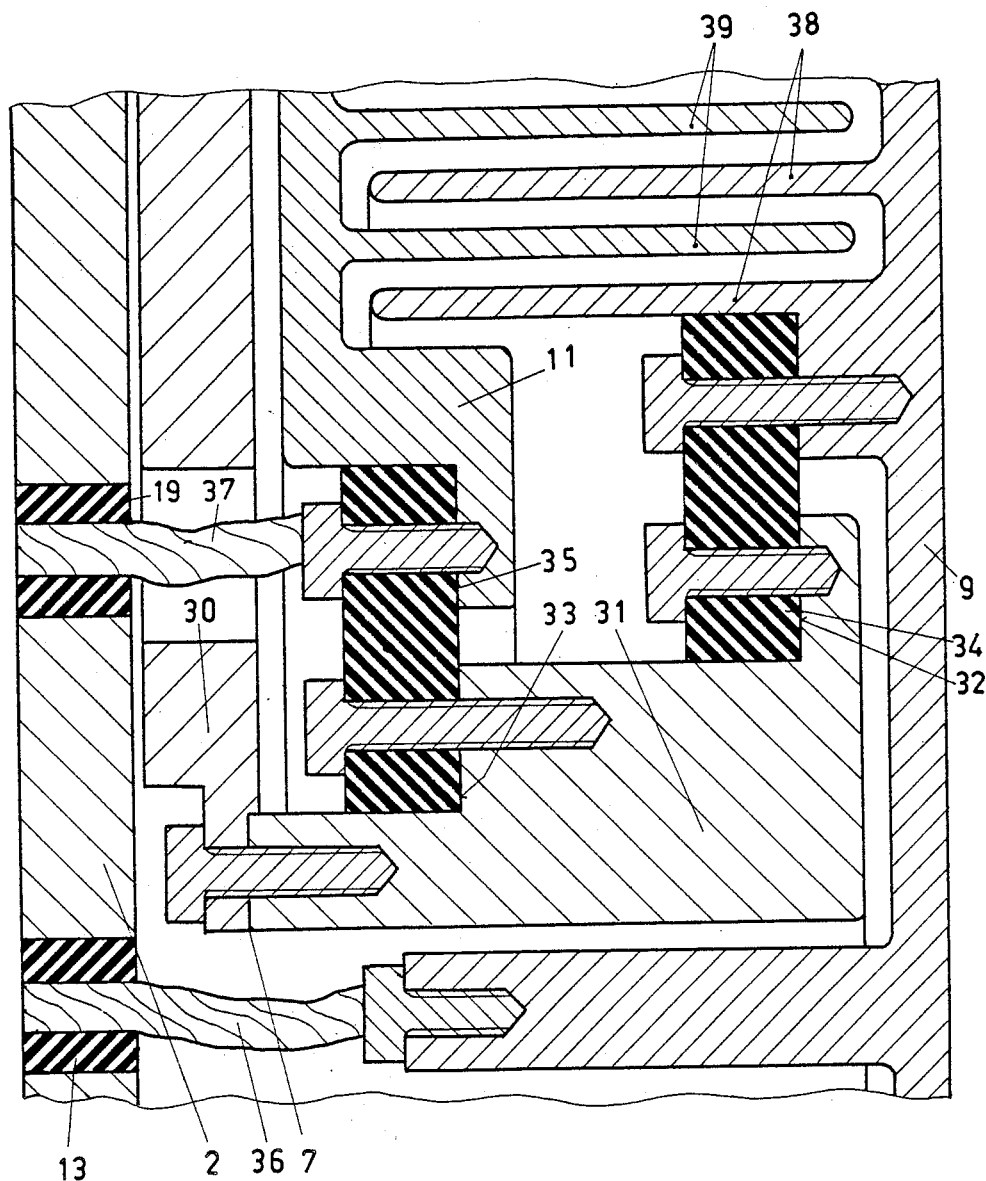
FIG. 2 is an enlarged, cross-sectional detailed view of the portion II of the voltage transformer embodiment shown in FIG. 1.

Referring to FIG. 2, support assembly 7 for electrode assembly 5, which is mounted in the interior of piping 2, comprises an axially extending holder 30 on which is screw mounted a transversely extending cylindrical support element 31 in the form of a pipe section, as shown. The exterior surface of support element 31 has stepped portions which define offset flanges 32,33 which are also spaced from each other with respect to the axis of support element 31. Annular insulating elements 34,35 which extend radially outwardly from support element 31 are attached, for example, by being screwed on, as shown, to the faces of flanges 32,33. As shown, test electrode 9 is attached to the same annular face of insulating alignment 34 which also partially abuts flange 32. Similarly, counter electrode 11 is attached to the same annular face of insulating element 35 which also partially abuts flange 33. Signals produced at test electrode 9 and counter electrode 11 are conducted by an electric connector 36 and 37, respectively, out of piping 2 via lead throughs 13 and 19 respectively. Test and counter electrodes 9 and 11 are so configured that they are rotationally symmetrical with respect to the axis of support element 31. Both electrodes are provided with at least two projecting rings 38 and 39, respectively, arranged concentrically with respect to one another. As shown, electrodes 9 and 11 are arranged with respect to one another such that rings 39 of counter electrode 11 are disposed out of contact with and between the rings 38 of test electrode 9.

In operation, the apparatus described above functions as follows. The currents supplied by the active capacitive voltage divider high-end voltage capacitors formed by inner conductor 1 and test electrodes 9 and 10, respectively, are compensated by amplifier circuits comprising transformers 21,27 and 22,28, and preamplifiers 17,18 respectively. These amplifier circuits are supplied with feedback via the associated low end voltage capacitors formed by the test and counter electrode pairs 9,11 and 10,12, respectively so that the amplifier input voltages are essentially zero. When amplification takes place in preamplifiers 17 and 18, the series-connected secondary windings 55,56 of transformers 27 and 28 are supplied with a test voltage which is essentially determined by the ratio between the capacitances of the high-end voltage and the low-end voltage capacitors. If the test values of the two voltage dividers differ from one another, lamp 29 provides an alarm signal.

Since leakage and test-cable capacitances cannot affect the test voltage because of the feedback, distortion of the test results can occur only through changes in the gas paths between the elements of the high-end and low-end voltage capacitors which change the capacitances thereof. A change in the especially critical gas paths between test electrodes 9,10 and counter electrodes 11,12 is prevented by mounting the electrodes on a flexurally rigid support element so as to be offset with respect to each other in the direction of the support element axis, and by mounting each electrode on the pipe section by means of an insulating element such that the same insulating element mounting surface partially abuts the pipe section and supports the electrode. These features reliably prevent axial displacements of the electrodes, and thus changes in the gas paths therebetween, due to shrinkage or swelling of the insulating elements, or due to bending of the support assembly as a result of pressure fluctuations in the insulating gas.

In addition, the use of two series-connected active capacitive voltage dividers further increases the test accuracy because the change in capacitances which is caused by change of the gas paths between inner conductor 1 and test electrode 9 or 10, respectively, as a result of displacement of inner conductor 1 from a position in alignment with the center axis of piping 2 does not effect the test results, since the changes in gas paths in the respective electrode assemblies are in opposition to each other and since the test voltage is obtained by forming the sum of the two voltage divider outputs.

Positioning of transformers 21,22 in the vicinity of the associated voltage dividers is also advantageous since the total transformation ratio, determined by the transformers 21,22 and the ratio of the capacitances of the corresponding high-end and low-end voltage capacitors, of the voltage transformer must be set only in this region. As a consequence, preamplifiers 17,18 and transformers 27,28 need only regulate the input voltage to zero, which allows amplifiers 17 and 18 to be uncalibrated and thus easily replaced.

Figure 3:
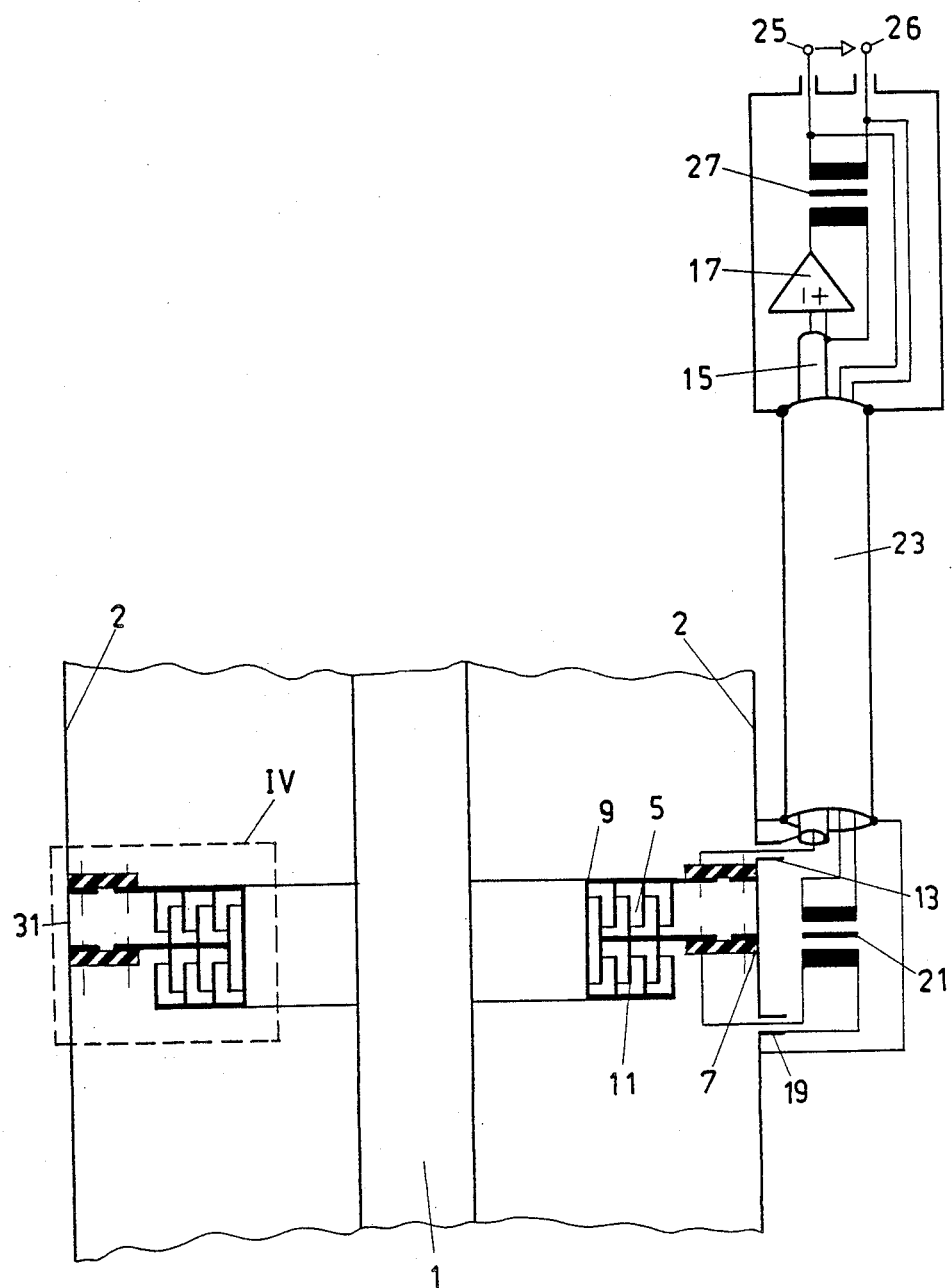
FIG. 3 is a partially diagramatic and partially schematic representation of a portion of a metal encapsulated, gas-filled high-voltage switching system incorporating a second embodiment of the voltage transformer of the present invention in which an electrode assembly for determining the test voltage axially surrounds the inner current conductor of the switching system.

Referring to FIG. 3, a second embodiment of the voltage transformer of the present invention differs from the embodiment shown in FIGS. 1 and 2 principally in that it comprises a single electrode assembly 5 which concentrically surrounds inner conductor 1 and a support assembly 7 having a cylindrical support element 31 which forms a part of the piping 2.

Figure 4:
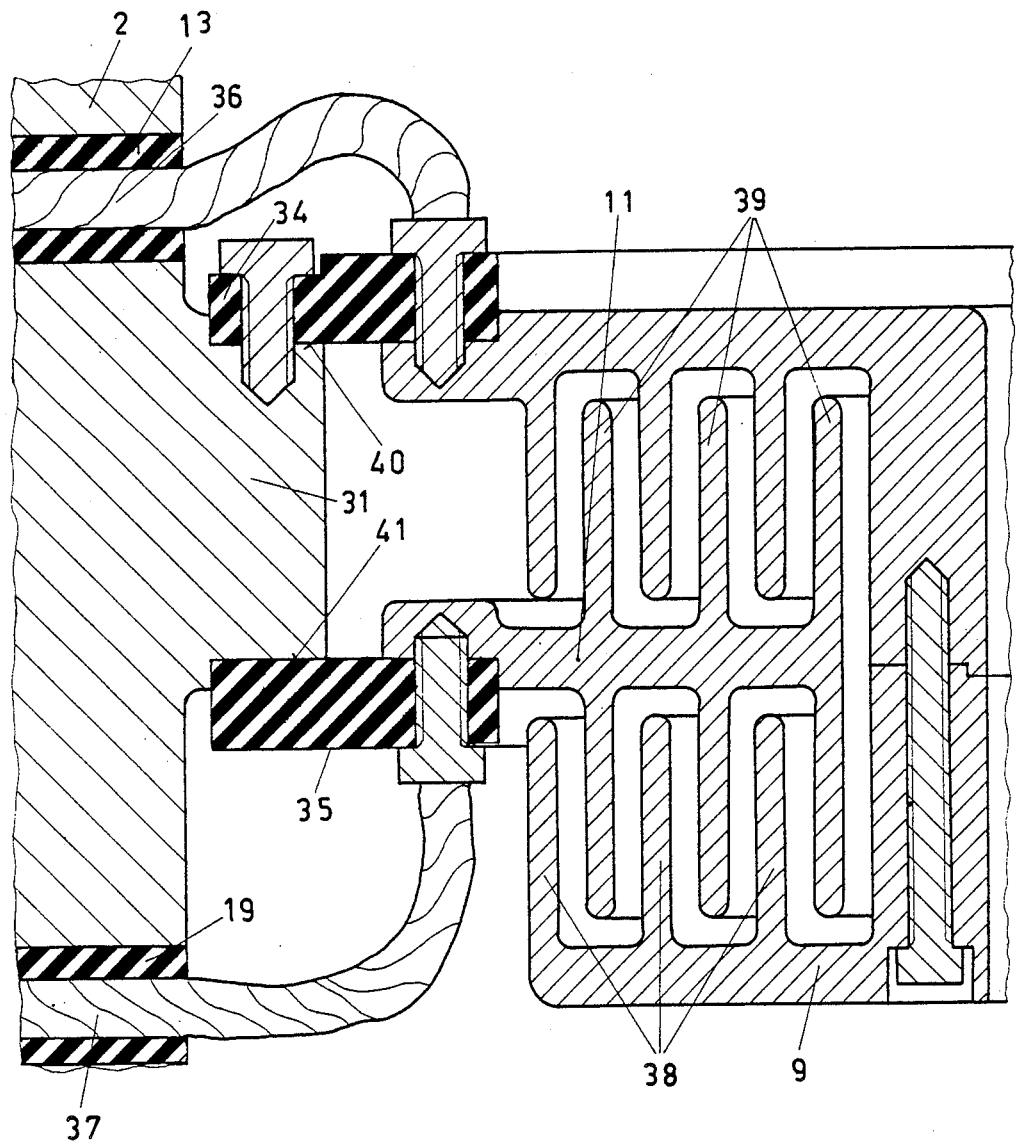
FIG. 4 is an enlarged, cross-sectional detailed view of the portion IV of the voltage transformer embodiment shown in FIG. 3.

As can be seen more clearly in FIG. 4, support element 31 is configured to form two radially extending and oppositely facing interior flanges 40,41. As in the case of the support element embodiment shown in FIGS. 1 and 2, flanges 40,41 are spaced from each other in the direction of the axis of element 31, and annular insulating elements 34 and 35 are respectively attached to the faces of flanges 40 and 41. Further, test electrode 9 is attached to insulating element 34 on the same annular face which partially abuts flange 40. Similarly, counter electrode 11 is attached to insulating element 35 on the same annular face which partially abuts flange 41. In contrast to the embodiment of FIGS. 1 and 2, counter electrode 11 is disposed inside test electrode 9, and comprises several upper and lower concentric cylindrical rings 39. Test electrode 9 similarly comprises several upper and several lower concentric cylindrical rings 38. As is the case with the embodiment shown in FIGS. 1 and 2, electrodes 9 and 11 are mounted such that rings 39 are disposed between rings 38 in non-contacting relationship thereto.

It will be appreciated that since this embodiment comprises a single electrode assembly, only one transformer and amplifier circuit is required, as shown.

This embodiment of the present invention has the advantage that the gas path between inner conductor 1 and test electrode 9 and between test electrode 9 and counter electrode 11 can change in any direction without appreciable change in the capacitances of the high-end and low-end voltage capacitors.

It will be appreciated by those of ordinary skill in the art that the disclosed preferred embodiments are illustrative and that changes and modifications can be made therein without departing from the spirit or scope of the invention.

I claim:

1. The combination of a metal encapsulated high voltage switching system filled with insulating gas and having a current-conducting inner conductor and a voltage transformer apparatus for measuring the voltage of said current-conducting inner conductor, said apparatus comprising an active capacitive voltage divider having a first test electrode at ground potential and an associated second counter electrode, said first and second electrodes each being in the form of a cylinder mounted by means of annular insulating elements on a support, said first electrode having a plurality of concentric rings extending outwardly in a direction radially from said cylinder to define at least two sockets therebetween, said second electrode having at least one socket formed from at least one concentric ring intervening with the rings of said first electrode, said rigid support element being in the configuration of a pipe section having an axis extending radially outwardly from said inner conductor, said pipe section having stepped portions spaced from each other with respect to said pipe axis, said stepped portions defining annular flanges with annular surfaces facing away from said inner conductor, said annular insulating elements partially abutting said annular flanges, said first electrode being attached to one of said insulating elements and said second electrode being attached to another of said insulating elements.

2. The combination as set forth in claim 1 and further comprising a holder in said metal encapsulated system and wherein said rigid support element is attached to the holder.

3. An electrode arrangement for use in an active capacitive voltage divider of a voltage transformer for measuring the voltage of a current-conducting conductor comprising:

a first test electrode in the shape of a first cylinder that is coaxial with a conductor whose voltage is to be measured, said cylinder provided with a plurality of concentric rings extending radially outwardy from said cylinder, said first test electrode and said conductor functioning as a high-voltage capacitor;

a second associated electrode in the shape of a second cylinder that is coaxial with said inner conductor, said second cylinder provided with at least one ring extending radially inwardly and interleaven with the concentric rings of said first cylinder, said second electrode and said first electrode functioning as a low-voltage capacitor;

a rigid support element in the shape of a pipe section having an axis extending radially outwardly from said conductor, said pipe section having stepped portions spaced from each other with respect to said pipe axis, said stepped portions defining annular flanges with annular surfaces facing away from each other; and annular insulating elements attached to said portions of said pipe and each partially abutting one of said annular surfaces and each attached to one of the first and second electrodes at a portion that does not abut one of said annular surfaces.

* * * * *